US005495169A

United States Patent [19]
Smith

[11] Patent Number: 5,495,169
[45] Date of Patent: Feb. 27, 1996

[54] CLAMP-ON CURRENT SENSOR

[76] Inventor: Dayle Smith, 1596 Turner Rd., Colorado Springs, Colo. 80920

[21] Appl. No.: 217,660

[22] Filed: Mar. 25, 1994

Related U.S. Application Data

[63] Continuation-in-part of Ser. No. 55,910, May 3, 1993, Pat. No. 5,418,514, which is a continuation of Ser. No. 336,569, Apr. 10, 1989, abandoned, which is a continuation-in-part of Ser. No. 925,540, Oct. 28, 1986, abandoned, which is a continuation of Ser. No. 660,459, Oct. 12, 1984, abandoned.

[51] Int. Cl.⁶ .............................. G01R 1/22; G01R 15/18
[52] U.S. Cl. ............................................ 324/127; 336/175
[58] Field of Search ................................... 324/127, 126; 336/175, 212

[56] References Cited

U.S. PATENT DOCUMENTS

| | | | |
|---|---|---|---|
| 2,175,934 | 10/1939 | Wentz | 336/175 |
| 2,501,558 | 3/1950 | Williams | 336/175 |
| 2,709,800 | 5/1955 | Temple et al. | 324/127 |
| 3,138,742 | 6/1964 | Schweitzer | 324/127 |
| 3,339,163 | 8/1967 | Wentz et al. | 336/212 |
| 3,621,392 | 11/1971 | LaJolla et al. | 324/127 |
| 3,768,011 | 10/1973 | Swain | 324/117 R |
| 4,059,798 | 11/1977 | Dierker et al. | 324/127 |
| 4,234,846 | 11/1980 | Maringer | 324/127 |
| 4,286,213 | 8/1981 | Fowler | 324/127 |
| 4,456,873 | 6/1984 | Schweitzer, Jr. | 324/127 |
| 4,513,246 | 4/1985 | Blain | 324/127 |
| 4,646,006 | 2/1987 | Schweitzer, Jr. | 324/127 |
| 4,706,017 | 11/1987 | Wilson | 324/127 |
| 4,794,329 | 12/1988 | Schweitzer, Jr. | 324/127 |
| 4,808,916 | 2/1989 | Smith-Vaniz | 324/127 |
| 4,839,600 | 6/1989 | Kuurstra | 324/127 |
| 4,998,060 | 3/1991 | Yeh | 324/127 |
| 5,055,771 | 10/1991 | Gamble et al. | 324/127 |
| 5,097,202 | 3/1992 | Gamble | 324/127 |
| 5,105,146 | 4/1992 | Wolf | 324/117 R |
| 5,180,972 | 1/1993 | Schweitzer, Jr. | 324/127 |
| 5,221,894 | 6/1993 | Herwig | 324/127 |
| 5,233,324 | 8/1993 | Beihoff et al. | 336/212 |

FOREIGN PATENT DOCUMENTS

| | | |
|---|---|---|
| 2512264 | 3/1983 | France . |
| 439996 | 1/1936 | United Kingdom . |
| WO93/06491 | 4/1993 | WIPO . |

OTHER PUBLICATIONS

U.S. Abstract of German Patent D8197808, Aug. 10, 1978, Landis & Gyrag, "Inductive Sensor for Measuring Voltages or Currents has Magnetic . . . " IEEE Transactions on Magnetics, vol. Mag–14, No. 5, Sep. 1978.
K. Murakami, et al., "A New Bridge–Connected Magnetic Circuit Using . . . " Multi–Tran, Model MT–1000, 10:1 Snap Around Extendor for A.C. Amperes, Property of the RMH Group, Inc.
Current Transformers: Split Current Transformers, Model FC, Flex–Core Diov., Morlan & Associates, Inc., p. 2.
Current Transformers: Removable Leg Current Transformer, Model, 331, Flex–Core Div., Morlan & Associates, Inc., p. 4.
Accessories and Specifications, Current Transformers.

*Primary Examiner*—Ernest F. Karlsen
*Attorney, Agent, or Firm*—Oblon, Spivak, McClelland, Maier, & Neustadt

[57] ABSTRACT

A clamp-on magnetic sensor includes a U-bar first magnetic core section and a straight magnetic core section that integrally fit together so that the straight magnetic core section is held in place by the U-bar. The compression and the mating of the surfaces to the U-bar and the straight magnetic core section provide superior response to sensed AC current.

20 Claims, 8 Drawing Sheets

CLAMP-ON CURRENT SENSOR

CROSS REFERENCE TO RELATED APPLICATIONS

This application is a continuation-in-part of U.S. application Ser. No. 08/055,910 filed May 3, 1993, now U.S. Pat. No. 5,418,514, and titled "AC CURRENT SENSOR AND METHOD OF MAKING SAME," which is a continuation of U.S. application Ser. No. 07/336,569 filed Apr. 10, 1989, now abandoned, which is a continuation-in-part of U.S. application Ser. No. 06/925,540 filed Oct. 28, 1986, now abandoned, which is a continuation of U.S. application Ser. No. 06/660,459 filed Oct. 12, 1984, now abandoned.

BACKGROUND OF THE INVENTION

1. Field of the Invention

This invention relates to the detection of alternating currents. More particularly, this invention relates to the detection of alternating currents that provide electrical power.

2. Description of the Background

Clamp-on current sensors are current sensors that can be placed around a current carrying wire while the wire is in a circuit. There is no need to remove the current carrying wire from the circuit in order to place a clamp-on sensor onto the wire. Clamp-on current sensors function by detecting the magnetic flux generated by the current carrying wire. In order to do this the clamp-on sensor must encircle the current carrying wire and provide a complete magnetic flux path around the current carrying wire. This is generally accomplished with sections of a magnetic material which clamp around the current carrying wire. Examples of such sensors appear in U.S. Pat. Nos. 2,709,800, 4,456,873, 4,513,246, 4,646,006, 4,794,329, 4,998,060, and 5,180,972, the teachings of which are hereby incorporated by reference.

The magnetic core material of a clamp-on sensor, in effect, amplifies the magnetic flux that is generated by the current carrying wire due to the magnetic permeability of the magnetic core material. That is, a magnetic flux, sometimes called a magnetic current, is induced in the magnetic core material in response to the magnetic flux of the current carrying wire. The changes in the total magnetic flux passing through the magnetic core of the clamp-on sensor is then detected by a magnetic flux transducer, amplified and/or processed to provide a suitable output voltage or current in a range corresponding to the measured current, all within the clamp-on sensor, and then the suitable output is made available for measurement external to the clamp-on sensor.

Conventional clamp-on transducers provide output voltages on the order of tens of millivolts. In order for clamp-on current sensors whose transducers have these low output voltages to be compatible with standard semiconductor voltage ranges of e.g., 0 to 5 volts DC, or −5 to 5 volts AC, their output must be amplified which requires active electronics in the clamp-on sensor requiring a source of power to the sensor. Moreover, available current sensors and, more particularly, clamp-on current sensors have a rather limited bandwidth. One reason for the limited bandwidth is because of the need for amplification of the low transducer output voltage and another reason is the type of transducers that are used.

Because clamp-on current sensors require mechanical opening and closing of the magnetic core sections forming the primary of their circuits they have a problem in reproducibility of their output signals. That is because the joints where the magnetic core sections of these clamp-on sensors are clamped together have a large magnetic reluctance associated with them (relative to the internal magnetic reluctance of the magnetic core sections) and the magnetic reluctance of these clamped regions is a sensitive function of the spacing and alignment of opposing surfaces of the magnetic core sections. Thus, each time a clamp-on sensor is clamped onto a current carrying wire, its output response to the current in the current carrying wire changes.

Modern developments in power transmission, especially power transmission inside of buildings has increased the efficient use of space. One result of this trend is that power cables are now lagged much closer to walls and much closer to one another than in the past. For example, power carrying cables may now be suspended from a wall with no more than a half an inch between the wall and the cable. In addition, power cables may be strung in buildings so that they are parallel to one another, running along a common wall, and separated by no more than half an inch. While these trends provide more efficient utilization of space in building designs, they conflict with the growing need to monitor the power provided to the building, by restricting the space available for a clamp-on current sensor.

Power monitoring is needed to protect sensitive electronic devices and to maintain efficient power consumption. Many buildings are now being built with a backup power source which can substitute for power provided from a power utility. Power monitoring allows the building to automatically switch from utility power to backup power when it is found that the utility power is unsatisfactory. In addition, many buildings are being retrofitted with power monitor and control systems.

Due to the close spacing of the permanently fixed power cables in modern buildings, it is difficult to fit a current sensor around them in order to monitor the current passing into and through the building. Many clamp-on sensors are of a type having handles which, when squeezed together, open two magnetic core sections so that the magnetic core sections may be placed around a lagged current carrying wire. However, these clamp-on sensors do not fit around the current carrying wire when there are parallel wires above and below the current carrying wire that is to be clamped. Moreover, conventional clamp-on sensors, even if they could be clamped around such cables, do not provide sufficient reliability, one to another and with respect to each time that they are clamped, and do not provide sufficiently large bandwidth response.

Large clamp-on current sensor bandwidth is very important. That is because one of the most important functions of power monitoring is to prevent high-frequency spikes in current occurring in the line power from reaching the electronic devices in a building. To that end it is necessary to have a current sensor that provides a high-frequency response. In this regard, high-frequency pulses on a power line tend to overload conventional clamp-on sensors by, for instance, overloading the active amplification circuits that amplify the relatively low millivolt transducer outputs of those devices. Consequently, such devices have a limited range of current that they can sense at high frequency, and also the active amplification circuits are easily damages by the spikes on power lines. Since the spikes on power lines are the most dangerous condition for building electronics, and the event that it is most desirable to protect against, conventional clamp-on sensors have only limited utility in the field of power monitoring.

It is also necessary to have reliability between various clamp-on current sensors' responses so that, for example, accurate measurements between the three different phases of power entering a building may be obtained. It is to overcoming thee problems that the present invention is directed.

SUMMARY OF THE INVENTION

It is an object of the present invention to overcome the aforementioned problems with conventional clamp-on sensors.

It is another object of the present invention to provide a clamp-on sensor which can readily be installed onto power cables running closely along the wall of a building and installed upon power cables that are also in close proximity to one another and aligned along the wall of a building, and which provides a reproducible and reliable response.

It is another object of this invention to provide a sensor which provides an output voltage on the order of volts without use of any active electronics or amplification of the sensor signal and to provide a very broad band frequency response and a large current range response.

In summary, the present invention provides a novel and improved clamp-on sensor comprising a U-bar magnetic core section having two extending arms segments each of which is connected to a central segment, and a straight magnetic core section having thereon a coil formed from a plurality of windings which transduces the flux in the core into a voltage signal.

The straight magnetic core section fits between the extending arms segments of the U-bar magnetic core section. The straight magnetic core section and the U-bar have self-aligning mating surfaces including the two ends of the straight magnetic core section and cavities on the extending arm segments of the U-bar, which intimately hold the U-bar and straight magnetic core section to one another when they are assembled.

The clamp-on sensor is assembled by spreading the two extending arm segments of the U-bar apart sufficiently to allow positioning of the straight magnetic core section so that the two ends of the straight magnetic core section oppose the two cavities. The two extending arm segments are then allowed to close so that the cavities close upon the two ends of the straight magnetic core section. The compressive force of the two extending arm segments drives the straight magnetic core section into a mating position in which the ends of the straight magnetic core section are aligned and mated to identically contoured surfaces of the two cavities, thus providing relatively low magnetic reluctance (relative to the magnetic reluctance of the magnetic core material) at the mating surface interfaces and providing a reproducible reluctance at the mating surface interfaces.

The number of the plurality of windings is relatively large and the wire diameter relatively small so that the coil therefore has a relatively high resistance on the order of kilo-ohms, and therefore does not drain much power from the current carrying wire, in addition to providing a voltage output on the order of volts. Further, the straight core section upon which the coil is wound is formed from mating first and second pieces of magnetic core material which are formed into a single structurally integral unit that includes a high magnetic reluctance interface.

The coil formed from the plurality of windings on the straight magnetic core section is preferably in parallel with an internal resistor in the clamp-on sensor. The internal resistor functions to prevent harmful shocks across the output terminals of the coil when large voltages are induced therein and also advantageously provides a way to change the output voltage across the two terminals of the coil for a specified current, in conjunction with a variable second resistor external to the clamp-on sensor but in parallel with the internal resistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
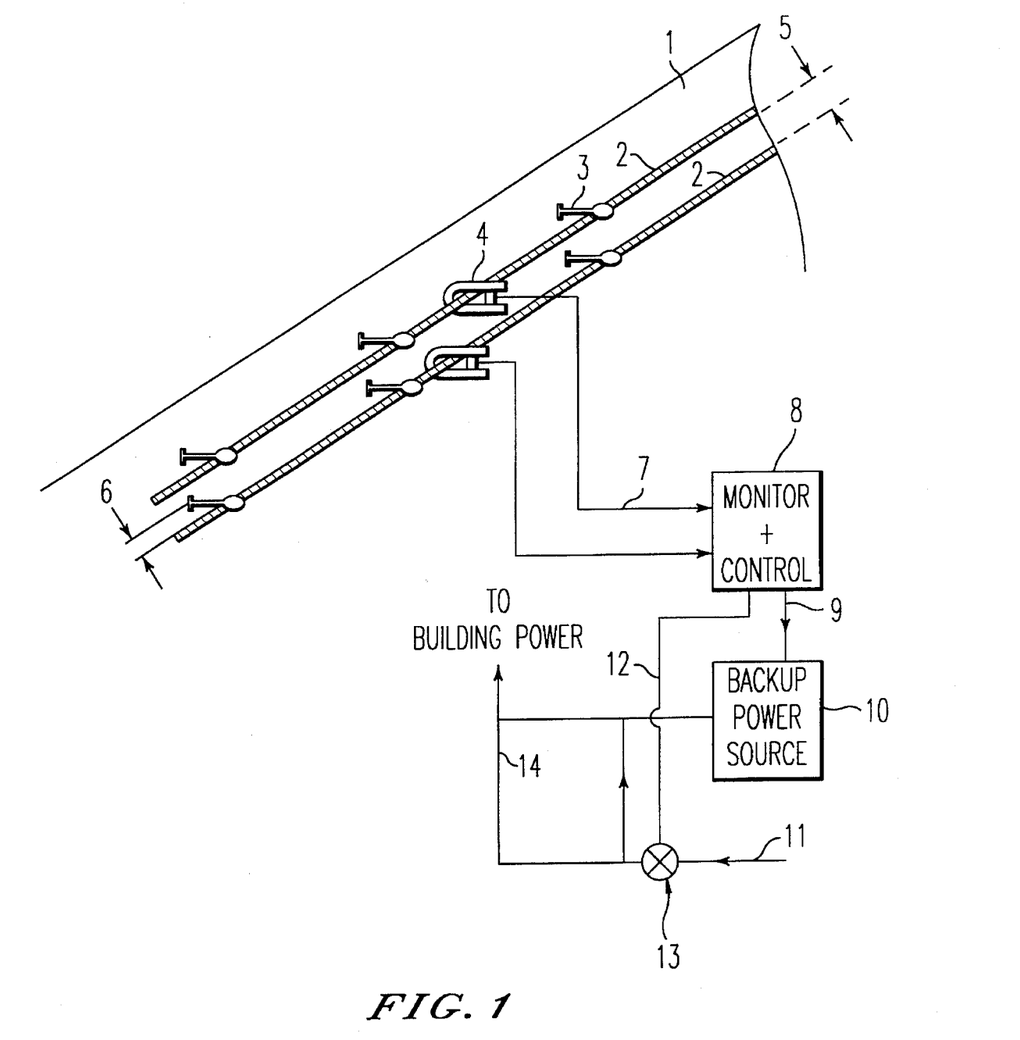
FIG. 1 is a schematic showing clamp-on current sensors mounted along a wall of a building and the relationship between the sensors and power supplied to the building in accordance with the present invention.

Various other objects, features and attendant advantages of the present invention will be more fully appreciated as the same becomes better understood from the following detailed description when considered in connection with the accompany drawings in which like reference characters designate like or corresponding parts throughout the several views and wherein:

FIG. 1 shows the wall 1 of a building to which are lagged power cables 2,2 by cable braces 3. A clamp-on sensor 4 is positioned to enclose one of the power cables 2 between a U-bar magnetic core section and a coil core 17 which includes a straight magnetic core section 31 (shown in FIG. 2A). The wall-cable spacing 6 may vary but is typically between one half inch and two inches and likewise the cable-cable spacing 5 may vary but is typically one half inch or greater. The clamp-on sensor 4 is connected to a monitor and control 8 by a sensor-monitor cable 7. The sensor-monitor cable 7 carries the electrical signal sensed by the clamp-on current sensor 4, without any amplification, directly to the monitor and control 8. The monitor and control 8 monitors the condition of the power being transmitted through the cable 2 including monitoring of 60 cycle harmonics to detect "dirty" power and to prevent dirty power from reaching any electronic devices in the building to which the wall 1 belongs.

When power that is deemed not acceptable for use is detected by the monitor and control 8, the monitor and control 8 sends signals to cut off the outside power source from the building and, instead, to deliver power to the building from a back-up power source. This is shown schematically in FIG. 1 by the sensor-monitor back-up power supply control line 9 controlling the back-up power supply 10 to provide power to the local power line 14 while also controlling the power switch 13 to switch out power from the external line power 11 by sending a signal along the sensor monitor-power switch line 12. Power from the local power line 14 enters the building to which the wall 1 is attached and eventually finds its way to the power cables 2,2.

Figure 2A:
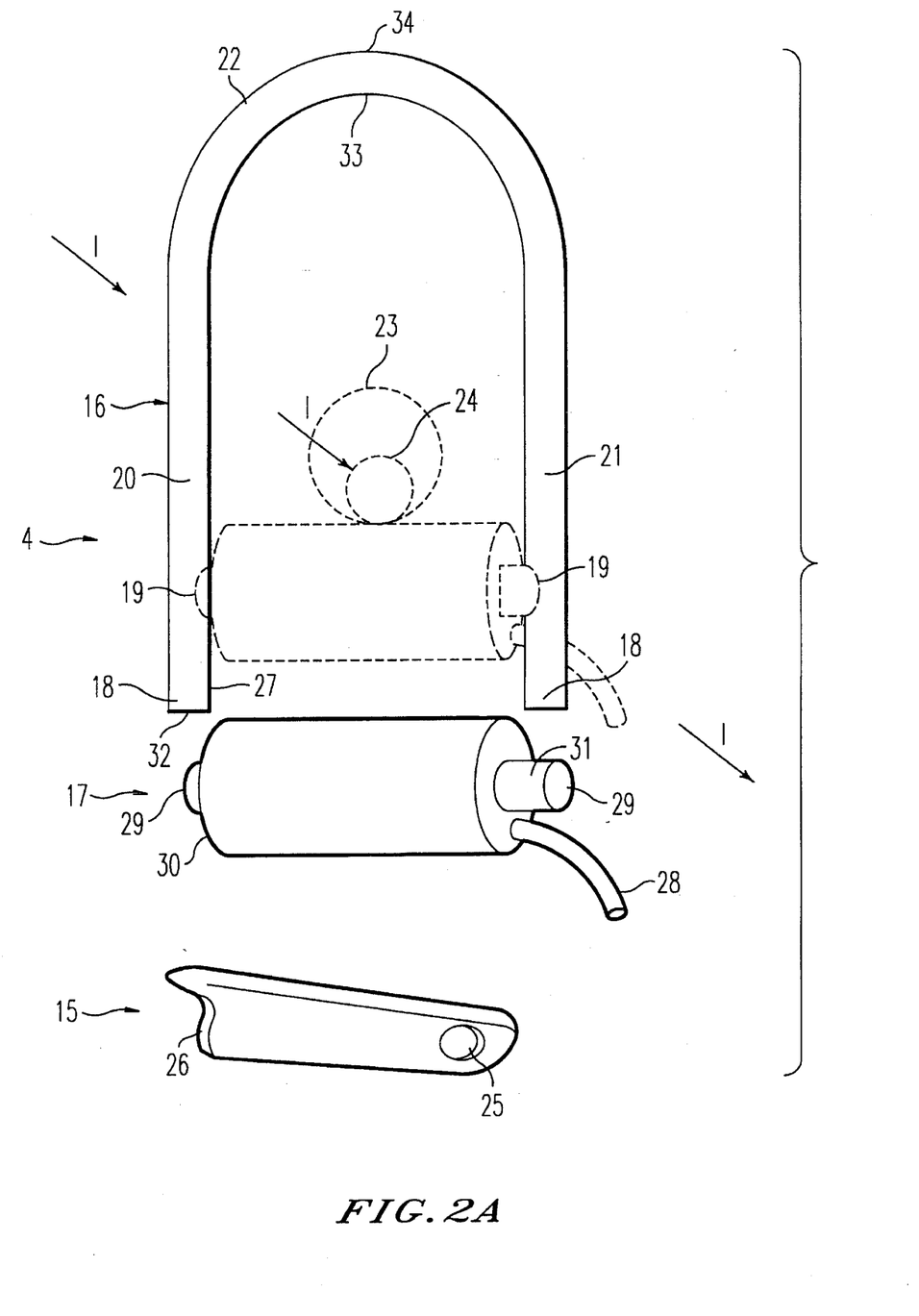
FIG. 2A is a perspective view of a clamp-on current sensor of a first embodiment of the invention and of a tool that is useful for assembling the clamp-on current sensor.

FIG. 2a indicates the path of the current that is to be measured by the letter I and the arrows along the letters I for one instant in time. In dashed lines are shown two alternative AC current wire diameters 23, 24, the current of which the clamp-on sensor 4 senses. The coil core 17 is shown in some detail with solid lines which are separated from the U-bar 16. The assembled position of the coil core 17 within the U-bar is also shown in dashed lines. Also, shown is the mounting tool 15 that is used to assemble the coil core 17 and the U-bar 16.

As shown in FIG. 2A, the U-bar 16 includes two U-bar ends 18, 18, a first parallel segment 20, a second parallel segment 21 which is parallel to the first parallel segment 20. Along each parallel segment the U-bar 16 has a concave mating surface 19, 19. The concave mating surfaces 19, 19 of each of the first and second parallel segments 20, 21 face one another. The U-bar also includes a curved segment 22, between the first and second parallel segments 20, 21, which has an inner surface 33 and an outer surface 34.

The coil core 17 may advantageously be mounted via use of the tool 15. This is accomplished by placing the hole 25 of the tool 15 over the end of the second parallel segment 21 and rotating the tool 15 to urge the cam surface 26 to a position between the U-bar ends 18, thereby spreading the U-bar ends 18 so that the convex mating surfaces 29 of the coil core 17 fit between the concave mating surfaces 19 of the U-bar. The tool 15 is then rotated about the axis of the hole 25 thereby allowing the U-bar first and second parallel segments 20, 21 to move towards one another thereby capturing the convex mating surfaces 29, 29 of the coil core in the concave mating surfaces 19, 19 of the U-bar and providing a compressive force on the coil core 17. Importantly, the mating surfaces 19, 19 and 29, 29 are shaped so that the compressive force provided by the U-bar 16 aligns the mating surfaces to one another so that the mating surfaces are in intimate contact over a wide area and over the same area each time the coil core 17 and U-bar 16 is assembled.

The mating surfaces 29, 29 are formed by the ends of the straight magnetic core section 31. The coil core 17 also includes a potted secondary coil 30 and a lead wire bundle 28 which provides the output leads from the two ends of the potted secondary coil 30, for external measurement.

In operation, it is preferred that the coil core 17 be adjacent to the AC current wire diameter 23, 24 to provide a more reliable response.

The U-bar 16 and the straight magnetic core section 31 are formed from high permeability magnetic material. One such class of materials is an alloy of nickel and iron comprising approximately 80% nickel which has a flux density carrying limit of about 6,500 gauss and a magnetic permeability, $\mu$, of about $6 \times 10^5$. Tradenames for this type of material include the "supermalloy" and "high $\mu 80$". The high $\mu 80$ has very low loss characteristics and includes 0.02% C, 0.5% Mn, 0.35% Si, 80% Ni, 4.2% Mo, and balance Fe. Another preferable alloy for the magnetic core is a nickel iron alloy comprising 49% nickel which has a magnetic permeability of approximately $10^5$ but a higher flux density limit of approximately 15,000 gauss. This alloy goes under the tradenames of "carpenter 49" or "alloy 4750". The magnetic core of the preferred embodiment is formed from straight barstock of these magnetic alloys which is then bent and/or machined into the appropriate shape. Preferably, the alloy is annealed after fabrication in order to restore its magnetic properties. Annealing of these magnetic alloys and the effect that has upon their magnetic properties is well known in the art.

The U-bar 16, if spread too far by the tool 15, will inelastically deform which is undesirable. Since the U-bar is preferably annealed, its elastic deformation strain is quite low. The tool 15 is designed to spread the U-bar by less than 0.2 inches so that the U-bar does not inelastically deform. Ideally, the tool 15 spreads the U-bar only by an amount necessary to allow entry of the coil core 17 between the two concave mating surfaces 19, 19. In the preferred embodiment the spreading distance provided by the tool 15 is about 0.160 inches. Moreover, in the preferred embodiment, the U-bar 16 remains spread beyond its equilibrium position by between 0.020 and 0.080 inches, and more preferably between 0.050 and 0.060 inches in order to provide the compressive force to the coil core 17 and to the mating surfaces 19, 19, and 29, 29.

Figure 2B:
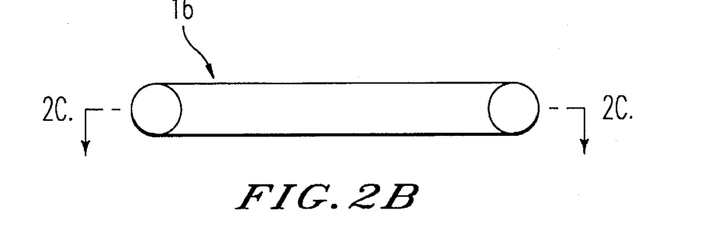
FIG. 2B is an end-on view of a U-bar magnetic core section of the first embodiment.

FIG. 2B shows an end-on view of the U-bar 16. In a preferred embodiment the distance W is approximately 2.388 inches and the diameter of the stock material from which the U-bar 16 is formed is 0.376 inches.

Figure 2C:
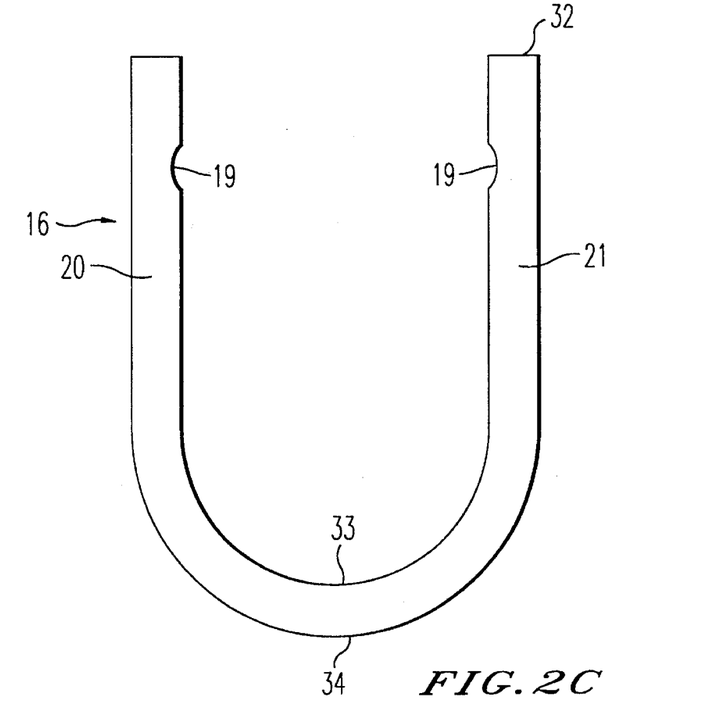
FIG. 2C is a view of the U-bar magnetic core section of FIG. 2B that has been rotated 90° into the page with respect to the line X–X' of FIG. 2B.

FIG. 2C shows the U-bar of FIG. 2B rotated 90° about the line X–X'. In a preferred embodiment the distance E is about 0.812 inches, the distance T is about 2.80 inches, the depth P of the concave mating surfaces 19, 19 is about 0.094 inches, the radius of curvature of the concave mating surfaces 19, 19, is about 0.376/2 (i.e., the same radius as the stock material), and the height H is about 4.25 inches. The total bar length of the U-bar is approximately 9.25 inches. With those dimensions in mind and the preferred spreading of the U-bar when the coil core 17 is in place of about 0.06 inches, the preferred strain on the arms of the U-bar is provided by an angular deviation between the two arms of the U-bar equal to the inverse sine of 0.06 inches 4.25 inches. The preferred strain provides superior linearity, frequency response, and reproducability, after reassembly of the clamp-on sensor 4.

Figure 2D:
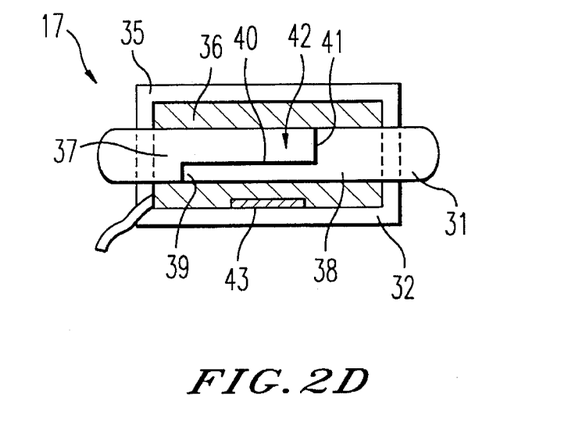
FIG. 2D is a sectional view through the center of a coil core of the first embodiment.

FIG. 2D shows a side-sectional view of the coil core 17. In preferred embodiment the length L is 2.388 inches and the width S is between 1.125 and 1.300 inches. The radius R in FIG. 2D is the same radius shown in FIG. 2C. The potting 35 encases the bobbin and coil 36 which axially enclose the first piece 37 and the second piece 38 of the straight magnetic core section 31. The first piece 37 and the second piece 38 are joined at the first interface 39, the second interface 40, and the third interface 41. The first, second and third interfaces 39, 40, 41 form a high magnetic reluctance joint 42 which reduces the nonlinearities in magnetic flux and somewhat reduces the total flux passing through the magnetic core of the clamp-on sensor. The internal resistor 43 is intimately related with the bobbin and coil 36, enclosed in the potting 35, and provided in parallel with the plurality of windings of that coil.

Figure 3A:
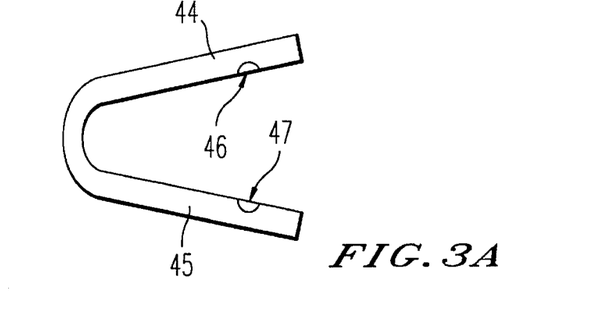
FIG. 3A shows a side-sectional view of a first alternative embodiment for a U-bar magnetic core section.

FIG. 3A shows an alternative embodiment for the U-bar 16, including a first non-parallel segment 44 that is not in parallel with a second non-parallel segment 45. The non-parallel segment 44 forms a half angle 46 which is between 0° and 45°. Preferably, the half angle is less than 15 degrees so that machining of the facing cavities 19 is kept simple. An angle between the first and second non-parallel segments may reduce flux coupling across the U-bar, which may be useful when measuring very high currents. Of course, the segments 44, 45 could be bent inward so that the opening of the U at the ends of the U was smaller than the opening of the U near the curved section of the U. However, that configuration would reduce the size of the wire that could be placed inside the U, but nevertheless would function.

The concave mating surfaces 47 are formed such that their deepest portions oppose one another for whatever the half angle 46 is. Thus, the concave mating surfaces 47 are formed so that when the coil core 17 is disposed therein, pressure from the segments 44, 45 captures the coil core 17 and provides alignment of the concave mating surfaces 19 with the concave mating surfaces 47.

Figure 3B:
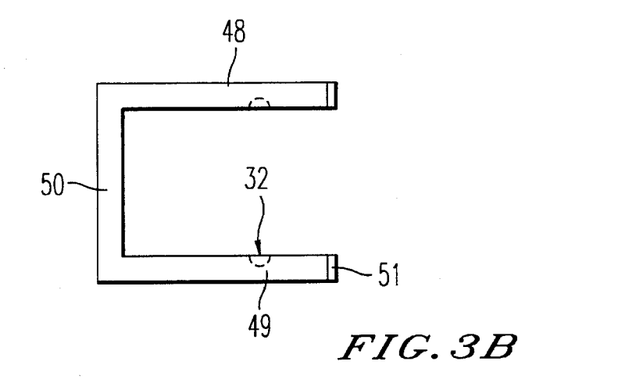
FIG. 3B shows a side-sectional view of a second alternative embodiment of a U-bar magnetic core section.

FIG. 3B shows a second alternative embodiment of the U-bar 16 having a non-curved central segment 50, first and second parallel segments 48, 49, and concave mating surfaces 52. In this embodiment it is shown that the magnetic core may be formed without a curved section.

As an alternative to the single integral magnetic cores formed from rodstock, it is possible to form these cores from high magnetic permeability laminations. When using such laminations to form these magnetic cores, the eddy currents are reduced when the laminations have electrically insulating material between them. Moreover, the laminations may be connected by a magnetic metallic end piece such as the end segment 51 shown in FIG. 3b.

Figure 4A:
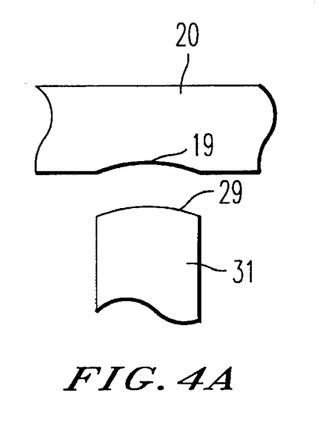
FIGS. 4A–4D show alternative embodiments for the self-aligning mating surfaces of one end of the straight magnetic core section that fits into the U-bar and opposing surfaces of the U-bar, FIGS. 4A–4C being side-sectional views and FIG. 4D being a perspective view.

FIG. 4a shows the mating convex surface 29 of the straight magnetic core section 31 opposing the mating surface 19 of the first parallel segment 20 of the U-bar 16.

Figures 4B, 4C:
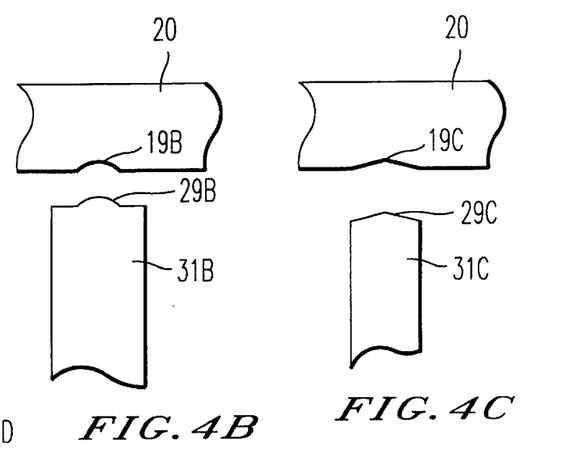

FIG. 4B shows an alternative set of self-aligning mating surfaces in which the alternative mating convex surface 29b does not span the entire end surface of the straight magnetic core section 31b and the end of the alternative straight magnetic core section 31b includes also flat surfaces outside of the curved region that oppose surfaces of the first parallel segment 20. In addition, the opposing surfaces of the first parallel segment 20 that oppose the flat surfaces of the end of the alternative straight magnetic core section 31b may be machined flat to increase the connected surface area between the two mating surfaces.

FIG. 4c shows a cross-section of another alternative embodiment for the mating surfaces in which the alternative mating surface 29c of the alternative straight magnetic core section 31c opposes and self-aligns with the alternative mating pointed cavity 19c. The surfaces 29c, 19c may be either be conical or multi-sided.

Figure 4D:
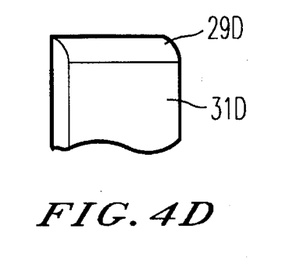

FIG. 4d shows another alternative in which surface 29d is an alternative cylindrically curved mating surface of an alternative straight magnetic core section 31d. This section may mate to a corresponding rectangularly outlined cavity having a cylindrical concave surface in the first parallel segment 20.

Figure 5A:
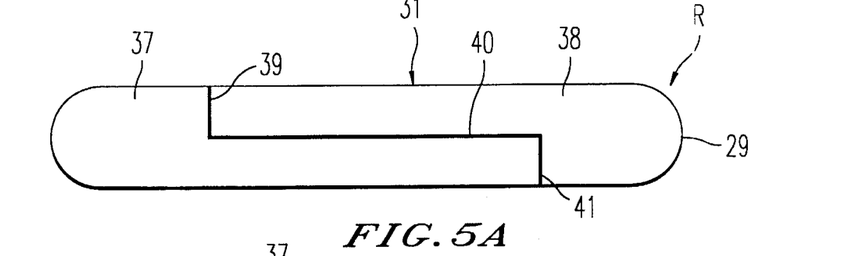
FIG. 5A is a side-sectional view of a straight magnetic core section of the first embodiment.

FIG. 5a shows in cross section a detailed view of the straight magnetic core section 31 which consists of the first piece 37 and the second piece 38 of magnetic core material. The interfaces 39, 40, 41 between the first piece 37 and the second piece 38 form a high magnetic reluctance joint. In a preferred embodiment the end length 53 is approximately 0.572 inches, the total length 54 is approximately 2.388 inches, the high reluctance joint length 55 is approximately 1.245 inches, and the radius of curvature R of the concave mating surfaces 29 is 0.188±0.002 inches. It is important to maintain the same tolerance and same radius for the concave mating surface 29 and the corresponding convex mating surface 19. In that way, a negligible, or at least a reproducible interface reluctance is provided between the mating surfaces 19, 29 so that reproducible low reluctance clamp-on sensor output characteristics may be obtained.

Figure 5B:
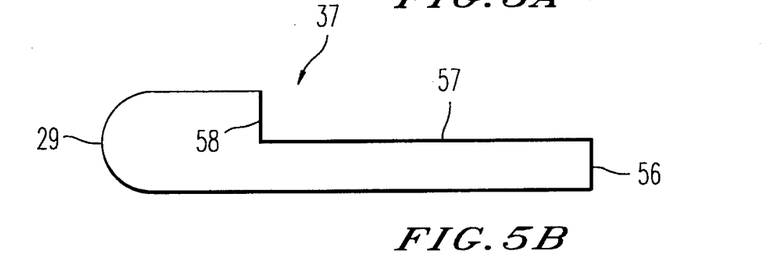
FIGS. 5B–5D are side-sectional views of alternative embodiments of a first piece of the straight core section of FIG. 5A.

FIG. 5B is a side-sectional view of the first piece 37 showing first, second, and third high reluctance joint surfaces 56, 57, and 58. The tolerances of these high reluctance joint surfaces is preferably maintained to a flat finish over their surfaces of ±20 microns.

Figures 5C, 5D:
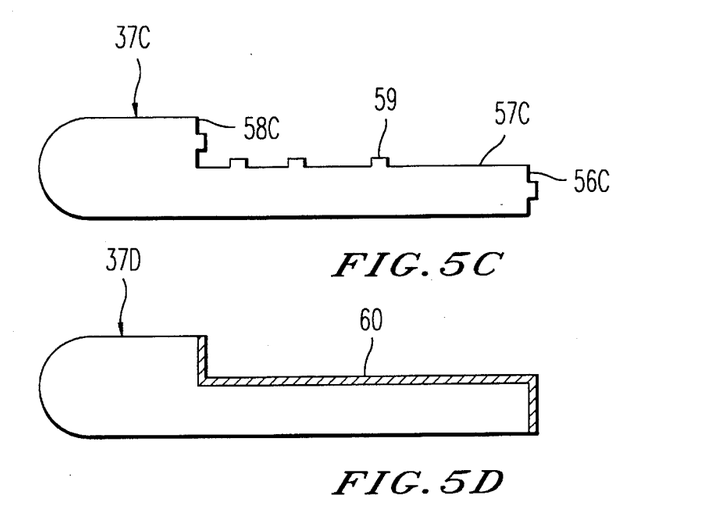

FIG. 5C shows a cross section of an alternative first piece 37c which includes alternative first, second and third high reluctance joint surfaces 56c, 57c, and 58c. Each of the alternative high reluctance joint surfaces 56c, 57c, and 58c may includes protrusions 59. The protrusions 59 are particularly useful for setting a gap between the alternative first piece 37c and a second piece such as second piece 38. Such protrusion may project up as little as a few microns or as much as 0.25 inches. The thicknesses of the sections 37, 38 may be adjusted accordingly so that the sections 37, 38 form straight magnetic core section 31 with smooth outer surfaces. In addition, the protrusions 59 advantageously allow reduced current to be used in an electric current welder when welding the first piece 37 and the second piece 38 together, since current only passes through the relatively small area protrusions and provides a more uniform weld by providing enough current to uniformly weld each of the protrusions 59.

FIG. 5D shows another alternative embodiment for the first piece 37 which includes instead, an alternative first piece 37E which has on its high reluctance joint surfaces a non-magnetic layer 60 which uniformly spaces the alternative first piece 37d from a second piece 38. The non-magnetic layer 60 may be formed by vacuum deposition of a non-magnetic material, such as a non-magnetic metal or a non-magnetic dielectric material. Such materials include copper, aluminum, glasses, metal oxides, and diamonds. The primary properties of the non-magnetic layer 60 are to provide a high reluctance joint and to be incompressible so that the reluctance of the joint does not change with time.

Multiple layers may be used instead of the layer 60, for instance, a diamond layer sandwiched between two metallic layers to allow welding of the first piece 38 to a metallic weldable layer.

Figure 5E:
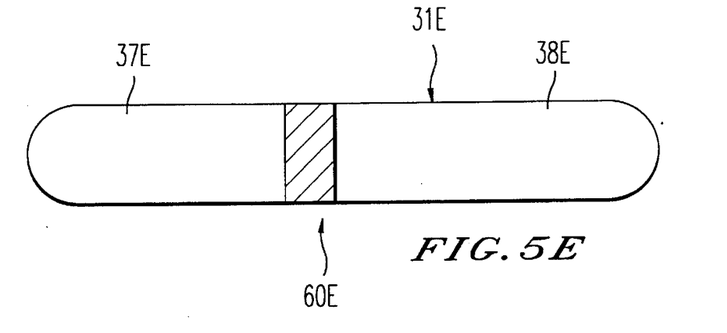
FIG. 5E is a side-sectional view of an alternative embodiment of the straight core section shown in FIG. 5A.

FIG. 5E shows another alternative straight magnetic core section 31E which includes alternative first piece 37E and alternative second piece 38E, and non-magnetic spacer 60E. Non-magnetic spacer 60E may be a separate structural element such as a washer or the like which spaces the pieces 37E, 38E from one another by as much as 0.5 inches. In this respect the present inventor has found that at very high currents there is more than adequate voltage output from the clamp-on sensor of the present invention when a large magnetic gap of this type is provided by the first piece 37E spaced far from the second piece 38E, and that this large spacing helps to reduce the heating of the clamp-on current sensor 4 when measuring large currents.

Figure 6:
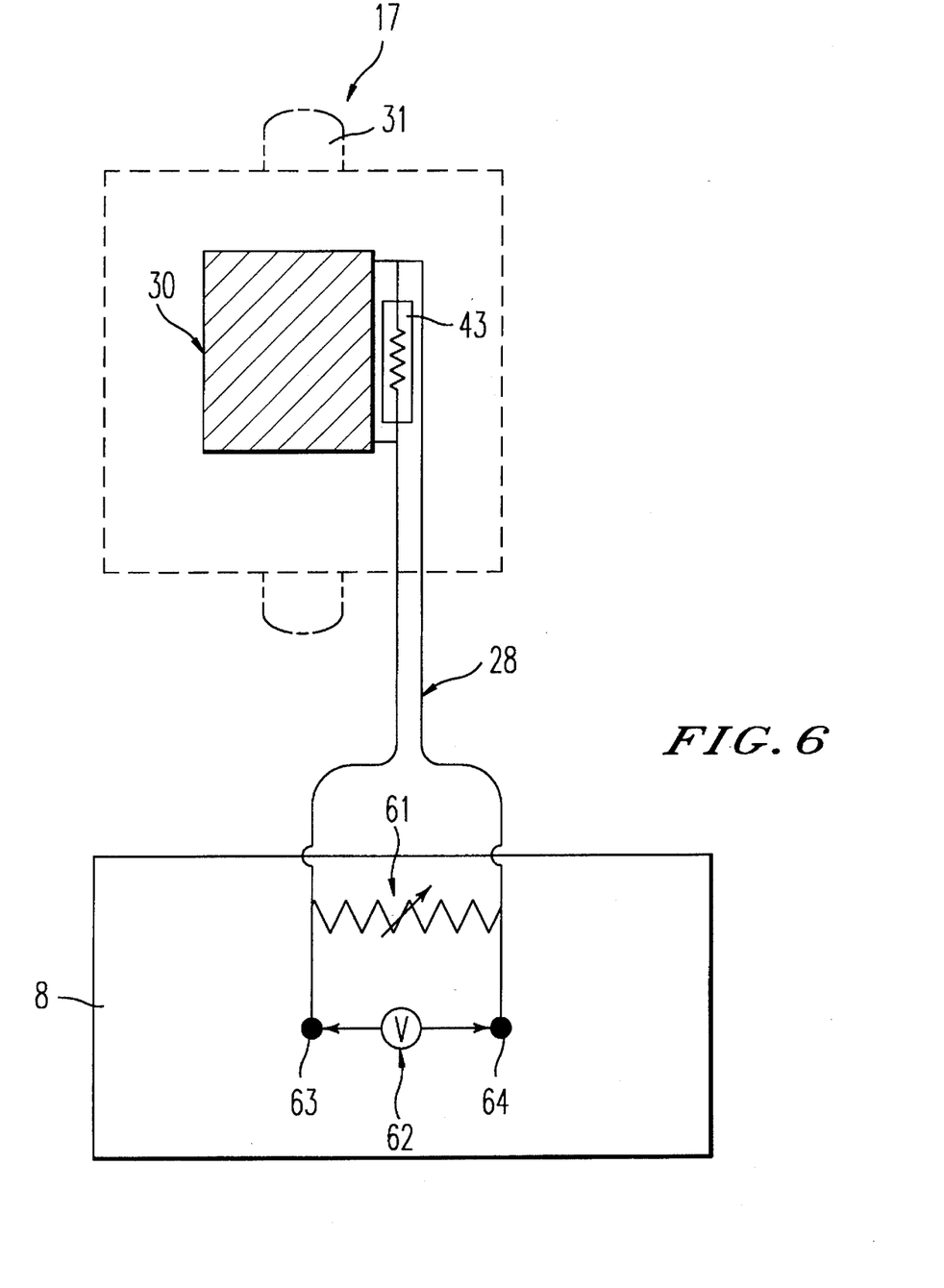
FIG. 6 is a schematic showing the electrical circuit of a coil core of the first embodiment and the interrelationship between that electrical circuit of the coil core and a sensor monitor and controller according to the invention.

FIG. 6 shows schematically the electrical configuration of the sensor in which the potted secondary coil 30 is shown in parallel with the internal resistor 43. The internal resistor 43 provides two functions. First, it protects a user from a shock due to a large voltage developed across the terminals of the plurality of windings forming the potted secondary coil 30. Second, the internal resistor 43 enables switching of the range of current that is to be measured by changing an external resistor 61 that is also in parallel with the internal resistor 43.

As shown in FIG. 6, the internal resistor 61 schematically represents a resistance provided by the monitor and control 8 in order to change the scale of the output voltage at the terminals 63, 64 which are measured by the voltage monitor 62. Thus, when a full scale of, for instance, 0–1,000 amperes is desired to be measured in the range of –5 to 5 volts, full scale, a low resistance for the variable resistor 61 is automatically set thereby reducing the voltage across the terminals 63, 64, for any given current passing through the potted secondary coil 30. In contrast, when a low current scale is desired to provide 0–5 V across the terminals 63, 64 as a full scale output, the resistance of variable resistor 61 is set to a relatively high value so that for any given magnetic current passing through the potted secondary coil 30 a relatively larger voltage will be provided across the terminals 63, 64.

In a preferred embodiment the internal resistor 43 has no frequency dependence. However, as an alternative it is possible to place a capacitive or inductive element in the position of the internal resistor 43 or to couple a capacitor or an inductor to the internal resistor 43 in order to provide frequency tuning. However, broadband frequency output is typically desired for these devices and thus a resistor is usually more suitable. Generally, however, any passive electrical element may be placed across the two terminals of the potted secondary coil 30 and included internal to the coil core 17. In this regard passive means that no source of power is necessary to drive such elements.

The potted secondary coil 30 includes a large plurality of windings, typically between 2,000 and 100,000 windings. When less than 2,000 windings are used the voltage output is typically not high enough for conventional –5 to 5 volts (or 3.3 volts AC peak values) inputs for conventional semiconductor based electronic monitoring equipment. When more than 100,000 windings are present on the potted secondary coil 30 the internal resistance of the coil itself detrimentally limits the voltage output of the coil. Moreover, as the number of windings on the potted secondary coil increases the frequency response at high frequencies is reduced because of the increasing inductance. Thus, more preferably, the potted secondary coil has between 10,000 and 40,000 windings, and in the preferred embodiment has 20,000 windings. The diameter of the wire used for the potted secondary coil depends upon the number of windings. For 20,000 windings number 44 gauge copper wire is preferably used, the wire is coated either with enamel or with a polymer and such wire is commercially available and well known. For sensors with less than 20,000 windings a larger gauge wire such as 40 gauge wire is used in order to reduce the sensor internal resistance. For a sensor with more windings, a smaller gauge wire, such as 47 or 48 gauge wire is used. The diameters of the wires that are preferable for the windings of the potted secondary range from 0.001 to 0.020 inches.

Figure 7A:
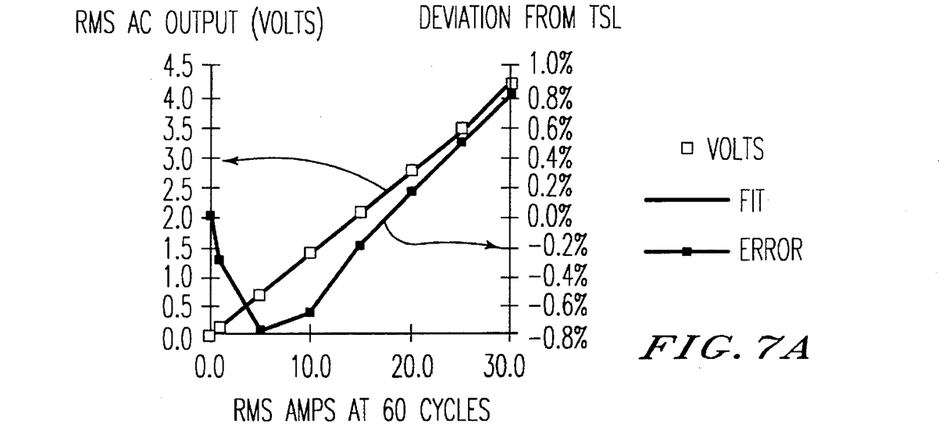
FIG. 7A is a graph showing the measured current and showing the linearity of output voltage response as a function of measured current.

FIGS. 7A–7C and 8A–8C show data for the same sensor. The data shown in these figures is for a sensor according to the preferred embodiment discussed hereinabove. FIG. 7A shows output voltage and deviation from the theoretical straight line for output voltage of the sensor when measuring amperage in a wire, from 0 to 30 amperes at 60 cycles. Excellent results are achieved with less than 1% deviation from the theoretical straight line over this range.

Figure 7B:
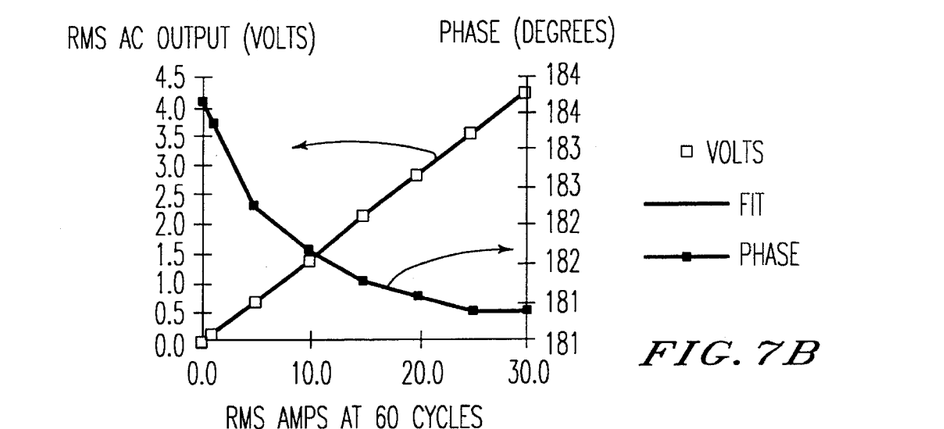
FIG. 7B is a graph showing the measured current and the output voltage response and the output phase of the output voltage.

FIG. 7B shows the output voltage and phase variation as a function of measured current at 60 cycles. As seen in FIG. 7B, the phase varies by less than 3° over the range of 0 to 30 amperes current. Note that in the scale per phase, only the absolute change in phase matters since there is a constant and arbitrary phase offset in the phase measuring device.

Figure 7C:
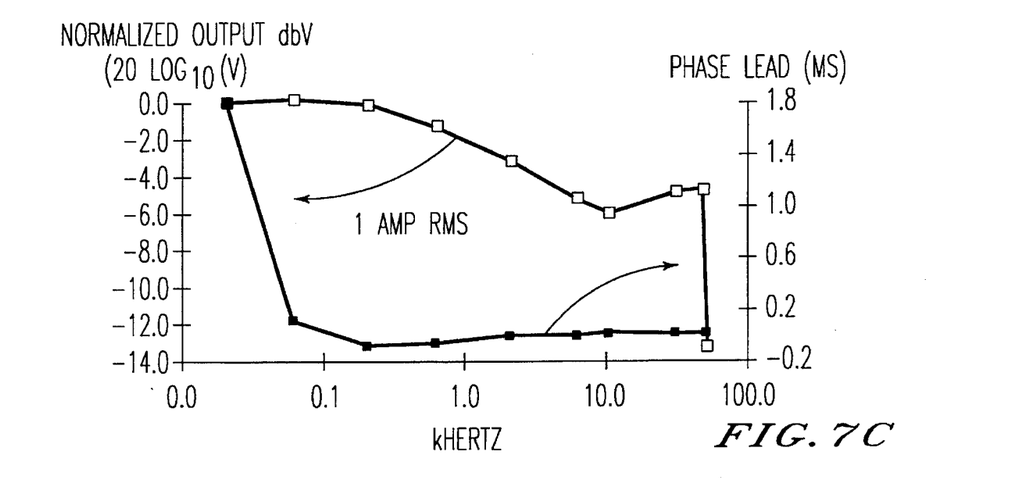
FIG. 7C shows frequency of one root means square (rms) amp of current versus normalized sensor output in dbV and the phase lead of the sensor output in milliseconds from 0 Hz to 60 KHz.

FIG. 7C shows the very important frequency response data for the clamp-on sensor of the preferred embodiment. It is important to note that the external resistance provided during the measurements in FIGS. 7A–7C for the variable resistor 61 shown in FIG. 6 is approximately 4,000 ohms, since that resistance gives a full-scale rms output of 0–5 V across the terminals 63 and 64 of FIG. 6. However, depending upon the number of windings of the coil 30, the resistance of the coil may vary from a few hundred ohms to well over 10,000 ohms, but is typically between 2000 and 10,000 ohms and is about 5500 ohms in the preferred embodiment.

FIG. 7C shows data for when a constant current of one amp rms is measured, but at frequencies ranging from 0 to 50 KHz. The open squares in FIG. 7C correspond to the normalized output in dbV and show that the normalized output drops by less than 6 dbV from 0 to almost 60 KHz. No other clamp-on or other types of current sensors provide comparable response over this frequency range. Also shown in FIG. 7C is the phase lead of the sensor output with respect to the current that is being measured which, above approximately 0.1 KHz, is essentially 0.

Figure 8A:
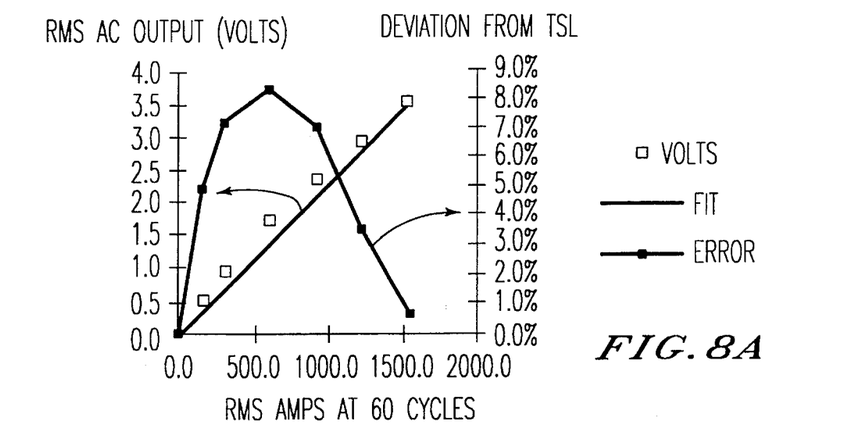
FIGS. 8A–8C show the same types of data as FIGS. 7A–7C, respectively, for the same sensor as in FIGS. 7A–C, but with a sensor monitor configured to measured current ranges from 0 to 1500 rms amperes.
Figure 8B:
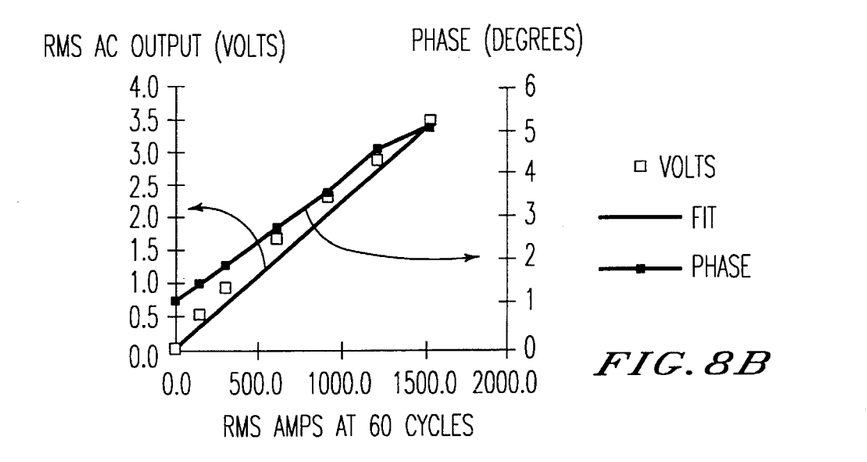

FIGS. 8A and 8B show the same type of data for the same sensor of the preferred embodiment as FIGS. 7A and 7B, but with a monitor and control set to measure 0 to 1,500 amperes full scale. That is, a much smaller resistor 61 is used in the monitor and control 8. The deviation from theoretical straight line of the rms output voltage over this current range is less than 9% and the phase variation is less than 6 percent. It is important to note that with respect to FIGS. 8A–8C the external variable resistor 61 is set to a value of approximately 80 ohms to provide a full scale output of 0–5 volts when the sensor output is converted to a DC voltage (via a diode network or the like converting approximately plus or minus 3.3 volts peak AC).

Figure 8C:
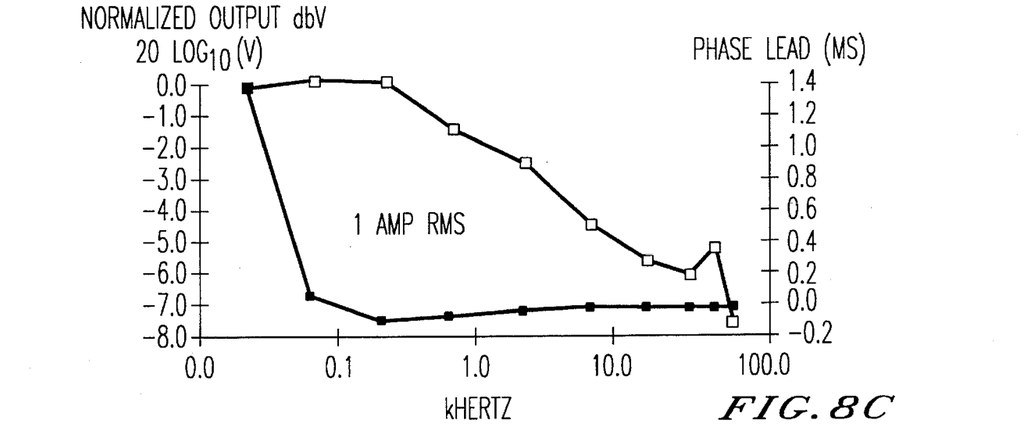

FIG. 8C shows the normalized output in dbV from 0–60 KHz with this value for resistance and shows that over the range of essentially 0–60 KHz there is an output drop of less than 6 dbV. Also, the phase lead of about 0.1 KHz is essentially 0. Thus, as shown in FIGS. 7A–8C, the preferred embodiment of the sensor of the present invention provides phenomenal bandwidth and current range response. Moreover, the sensor of the preferred embodiment of the present invention may be clamped onto wires that are in confined spaces as indicated by the description of FIG. 1 and provides repeatability and reliability in measurements due to the self-aligning nature of the convex mating surfaces 29, 29 with the concave mating surfaces 19, 19.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A clamp-on magnetic sensor, comprising:

a U-bar first magnetic core section comprising a central segment connected to first and second end segments, the first end segment having a first end segment end and the second end segment having a second end segment end, the first end segment extending in a first direction, the second end segment extending in a second direction, the first and second directions forming an angle of less than 90 degrees, a first cavity having a first surface contour formed by a surface of the first end segment and having a deepest first cavity position which is a first distance from the first end segment end, a second cavity having a second surface contour formed by a surface of the second end segment and having a deepest second cavity position which is at a second distance from the second end segment end, the first and second cavities facing one another and their deepest positions being separated by an end segment spacing distance;

a coil core comprising a second magnetic core section and a coil including a plurality of windings wound around the second magnetic core section, the second magnetic core section having a first coil core end with a curved or pointed surface contour that mirrors the first surface contour of the first cavity, the second magnetic core section having a second coil core end with a curved or pointed surface contour that mirrors the surface contour of the second cavity, the coil core having a coil core length between the first and second coil core ends;

wherein when the first coil core end presses against the first cavity and the second coil core end presses against the second cavity, the coil core is gripped by the U-bar such that the surface contour of the first coil core end is flush with the first surface contour of the first cavity and the surface contour of the second coil core end is flush with the second surface contour of the second cavity.

2. A sensor according to claim 1, wherein:

the first and second directions form an angle of less than 30 degrees from one another.

3. A sensor according to claim 1, wherein:

the first and second directions are parallel to one another.

4. A sensor according to claim 1, wherein;

the first and second cavities are concave and the first and second coil core ends are convex.

5. A sensor according to claim 1, wherein the first and second coil core ends are pointed.

6. A sensor according to claim 1, wherein the first and second cavities and the first and second coil core ends all have spherical surfaces of the same radius.

7. A sensor according to claim 1, wherein said plurality of windings comprises between 2000 and 100,000 windings.

8. A sensor according to claim 1, wherein said plurality of windings comprises between 10,000 and 40,000 windings.

9. A sensor according to claim 1, wherein said plurality of windings has a resistance of between 2,000 and 10,000 ohms.

10. A sensor according to claim 1, wherein said plurality of windings comprises approximately 20,000 windings and has a resistance of about 5,500 ohms.

11. A sensor according to claim 1, wherein the coil core further comprises a resistor in series with said coil.

12. A sensor according to claim 1, wherein said second magnetic core section comprises first and second magnetic sections jointed at a high reluctance joint.

13. A sensor according to claim 12, wherein the first magnetic section comprises a joint surface and protrusions on the joint surface.

14. A sensor according to claim 1, wherein said second magnetic core section comprises first and second magnetic sections and a nonmagnetic spacer between the first and second magnetic sections.

15. A sensor according to claim 1, wherein the first and second magnetic core sections each comprise an alloy of Ni and Fe of between 40 and 80 percent Ni.

16. A sensor according to claim 1, wherein said plurality of windings are formed from copper wire with a diameter of between 0.001 and 0.020 inches.

17. A sensor according to claim 1, having the property of providing a frequency response, when measuring 1 root mean square ampere, that changes by less than 6 dbV from 0.1 to 50,000 hertz.

18. A sensor according to claim 17, having the property of providing a voltage output directly at terminals of the plurality of windings of 0 to 5 volts for a selected range of current to be measured.

19. A sensor according to claim 18, having the property of providing an output of rms voltage in response to measurement of current at 60 cycles, that is within 1 percent of linearity for measurement of 0–30 amperes and within 8 percent of linearity for measurement of between 0 and 1000 amperes.

20. A sensor according to claim 19, having the property of providing a voltage output whose phase with respect to the current that is being measured varies by less than 6 degrees when the current to be measured varies between 0 and 1000 amperes.

* * * * *